US007826298B2

(12) United States Patent
Nakai et al.

(10) Patent No.: US 7,826,298 B2
(45) Date of Patent: Nov. 2, 2010

(54) SEMICONDUCTOR MEMORY DEVICE WITH LOW STANDBY CURRENT

(75) Inventors: Hiroaki Nakai, Tokyo (JP); Hirotoshi Sato, Tokyo (JP); Kiyoyasu Akai, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 201 days.

(21) Appl. No.: 12/153,308

(22) Filed: May 16, 2008

(65) Prior Publication Data
US 2008/0291754 A1 Nov. 27, 2008

(30) Foreign Application Priority Data
May 24, 2007 (JP) ............... 2007-138214

(51) Int. Cl.
*G11C 7/00* (2006.01)
(52) U.S. Cl. ............... 365/229; 365/226; 365/227; 365/185.24; 365/154
(58) Field of Classification Search ............... 365/229, 365/226, 227, 185.24, 154
See application file for complete search history.

(56) References Cited

U.S. PATENT DOCUMENTS 5,646,900 A * 7/1997 Tsukude et al. ............ 365/205

| 7,200,030 | B2 * | 4/2007 | Yamaoka et al. | ............ 365/154 |
| 7,362,646 | B2 * | 4/2008 | Otsuka et al. | ............... 365/226 |
| 7,542,368 | B2 * | 6/2009 | Ishikura et al. | ............. 365/226 |
| 2004/0238875 | A1 * | 12/2004 | Nakai | ............... 257/314 |

FOREIGN PATENT DOCUMENTS

JP 2005-293751 10/2005

OTHER PUBLICATIONS

Yamaoka, Masanao, et al., "A 300 MHz 25 uA/Mb Leakage On-Chip SRAM Module Featuring Process-Variation Immunity and Low-Leakage-Active Mode for Mobile-Phone Application Processor," ISSCC 2004/Session 27/SRAM/27.2, 2004.
Yamaoka, Masanao et al., "Low-Power Embedded SRAM Modules with Expanded Margins for Writing," ISSCC 2005/Session 26/Static Memory/26.4, pp. 480-481, 2005.

* cited by examiner

*Primary Examiner*—Connie C Yoha
(74) *Attorney, Agent, or Firm*—McDermott Will & Emery LLP

(57) ABSTRACT

In an SRAM according to the present invention, an internal power supply voltage for a memory cell is applied to a back gate of each of P-channel MOS transistors included in an equalizer, a write driver, and a column select gate. Therefore, even if an internal power supply voltage for a peripheral circuit is shut off to reduce current consumption during standby, a threshold voltage of each of the P-channel MOS transistors is maintained at a high level, and hence a leakage current is small.

11 Claims, 9 Drawing Sheets

INVENTION OF THE PRESENT APPLICATION

CONVENTIONAL EXAMPLE $Vgs = Vg - Vs$ $Vbs = Vb - Vs$

SEMICONDUCTOR MEMORY DEVICE WITH LOW STANDBY CURRENT

BACKGROUND OF THE INVENTION

1. Field of the Invention

The present invention relates to a semiconductor memory device, and particularly relates to a semiconductor memory device in which a memory cell and a write/read circuit are driven by different power supply voltages, and in which the power supply voltage for the write/read circuit is shut off during standby to reduce a standby current.

2. Description of the Background Art

Conventionally, a reduction in standby current has been promoted in an SRAM (Static Random Access Memory). In some SRAMs, a power supply voltage SVDD for a memory cell and a power supply voltage VDD for a peripheral circuit are separately supplied, and power supply voltage VDD for the peripheral circuit is shut off during standby to reduce a standby current. Note that power supply voltage SVDD for the memory cell is not shut off even during standby for retaining stored data.

Furthermore, in other SRAMs, a source voltage of a driver transistor for a memory cell is increased to a voltage (0.3 V) slightly higher than a ground voltage VSS during standby, to promote reduction in subthreshold leakage current in the memory cell, while retaining stored data (see ISSCC 2004/SESSION 27/SRAM/27.2 "A 300 MHz 25 µA/Mb Leakage On-Chip SRAM Module Featuring Process-Variation Immunity and Low-Leakage-Active Mode for Mobile-Phone Application Processor", Masanao Yamaoka et al.).

However, a standby current has not sufficiently been reduced in the conventional SRAM.

SUMMARY OF THE INVENTION

Therefore, a main object of the present invention is to provide a semiconductor memory device with a low standby current.

A semiconductor memory device according to an aspect of the present invention is a semiconductor memory device driven by first and second power supply voltages during a normal operation, the second power supply voltage supplied to the semiconductor memory device being shut off during standby, and the semiconductor memory device includes: a memory cell; and a write/read circuit. The memory cell is driven by the first power supply voltage and stores data. The write/read circuit is driven by the second power supply voltage and writes data into and reads data from the memory cell. The write/read circuit includes a P-channel MOS transistor having a back gate receiving the first power supply voltage, having a source receiving the second power supply voltage, and having a drain connected to the memory cell.

Furthermore, a semiconductor memory device according to another aspect of the present invention is a semiconductor memory device driven by first and second power supply voltages during a normal operation, the second power supply voltage supplied to the semiconductor memory device being shut off during standby, and the semiconductor memory device includes: a memory cell; and a write/read circuit. The memory cell is driven by the first power supply voltage and stores data. The write/read circuit is driven by the second power supply voltage and writes data into and reads data from the memory cell. The write/read circuit includes a P-channel MOS transistor having a source receiving the second power supply voltage, and having a drain connected to the memory cell. The semiconductor memory device further includes: a pull-up circuit providing the first power supply voltage to a gate of the P-channel MOS transistor during the standby to thereby bring the P-channel MOS transistor out of conduction.

Furthermore, a semiconductor memory device according to still another aspect of the present invention is a semiconductor memory device driven by first and second power supply voltages during a normal operation, the second power supply voltage supplied to the semiconductor memory device being shut off during standby, and the semiconductor memory device includes: a memory cell; and a write/read circuit. The memory cell is driven by the first power supply voltage and stores data. The write/read circuit is driven by the second power supply voltage and writes data into and reads data from the memory cell. The write/read circuit includes a first P-channel MOS transistor having a first threshold voltage, and a second P-channel MOS transistor having a source receiving the second power supply voltage, having a drain connected to the memory cell, and having a second threshold voltage, an absolute value of the second threshold voltage being larger than an absolute value of the first threshold voltage.

In the write/read circuit in the semiconductor memory device according to an aspect of the present invention, the P-channel MOS transistor, which has a source receiving the second power supply voltage and has a drain connected to the memory cell, has a back gate receiving the first power supply voltage. Therefore, even if the second power supply voltage is shut off during standby, a threshold voltage of the P-channel MOS transistor is maintained high, so that only a small amount of standby current is required.

Furthermore, in the semiconductor memory device according to another aspect of the present invention, there is provided the pull-up circuit providing the first power supply voltage to the gate of the P-channel MOS transistor in the write/read circuit during standby to thereby bring the P-channel MOS transistor out of conduction. Therefore, even if the second power supply voltage is shut off during standby, the P-channel MOS transistor is brought out of conduction, so that only a small amount of standby current is required.

Furthermore, in the write/read circuit in the semiconductor memory device according to still another aspect of the present invention, the second P-channel MOS transistor, which has a source receiving the second power supply voltage and has a drain connected to the memory cell, is allowed to have the second threshold voltage set higher than the first threshold voltage of the other first P-channel MOS transistor. Therefore, even if the second power supply voltage is shut off during standby, the threshold voltage of the second P-channel MOS transistor is high, so that only a small amount of standby current is required.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
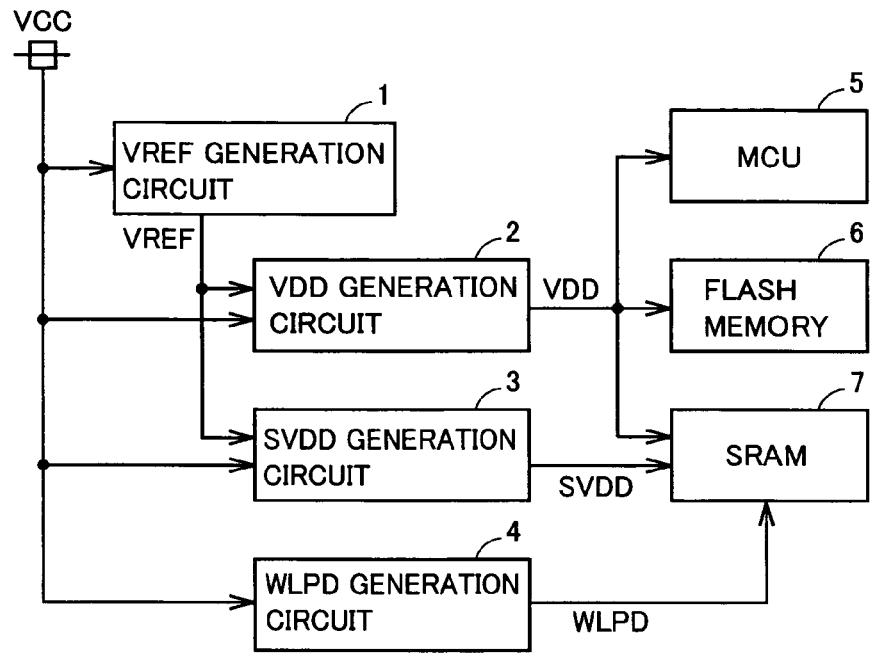
FIG. 1 is a block diagram that shows a substantial part of a portable information terminal according to a first embodiment of the present invention.

FIG. 1 is a block diagram that shows a substantial part of a portable information terminal according to a first embodiment of the present invention. In FIG. 1, the portable information terminal includes a VREF generation circuit 1, a VDD generation circuit 2, an SVDD generation circuit 3, a WLPD generation circuit 4, a microcomputer unit (MCU) 5, a flash memory 6, and an SRAM 7.

VREF generation circuit 1 is driven by an external power supply voltage VCC (e.g. 3 V) supplied from a battery or the like, and generates a reference voltage VREF (e.g. 1.5 V). VDD generation circuit 2 is driven by external power supply voltage VCC, and generates an internal power supply voltage VDD which is at the same level as that of reference voltage VREF during a normal operation of the portable information terminal, and stops supply of internal power supply voltage VDD to reduce a standby current during standby of the portable information terminal. SVDD generation circuit 3 is driven by external power supply voltage VCC, and generates an internal power supply voltage SVDD which is at the same level as that of reference voltage VREF. WLPD generation circuit 4 sets a control signal WLPD to a non-activated level, namely, an "L" level (a ground voltage VSS) during a normal operation of the SRAM, and sets control signal WLPD to an activated level, namely, an "H" level (external power supply voltage VCC) during standby of the SRAM.

Microcomputer unit 5 is driven by internal power supply voltage VDD, and controls the entire portable information terminal. Flash memory 6 is a nonvolatile semiconductor memory device driven by internal power supply voltage VDD, and stores data. SRAM 7 is a volatile semiconductor memory device driven by internal power supply voltages VDD, SVDD, is controlled by control signal WLPD or the like, and stores data.

Figure 2:
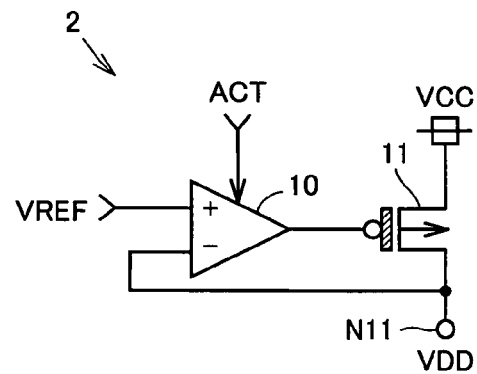
FIG. 2 is a circuit diagram that shows a configuration of a VDD generation circuit shown in FIG. 1.

FIG. 2 is a circuit diagram that shows a configuration of VDD generation circuit 2. In FIG. 2, VDD generation circuit 2 includes an operational amplifier 10 and a P-channel MOS transistor 11. P-channel MOS transistor 11 is connected between a line for supplying external power supply voltage VCC and an internal power supply node N11. Operational amplifier 10 is controlled by a control signal ACT. Control signal ACT is set to an activated level during a normal operation of the portable information terminal, and set to a non-activated level during standby of the portable information terminal.

When control signal ACT is set to an activated level, operational amplifier 10 controls a gate voltage of P-channel MOS transistor 11 such that voltage VDD of power supply node N11 matches reference voltage VREF, and when control signal ACT is set to a non-activated level, operational amplifier 10 brings P-channel MOS transistor 11 out of conduction. Therefore, during a normal operation of the portable information terminal, internal power supply voltage VDD is maintained at a voltage (1.5 V) equal to reference voltage VREF, and during standby of the portable information terminal, supply of internal power supply voltage VDD is shut off.

Figure 3:
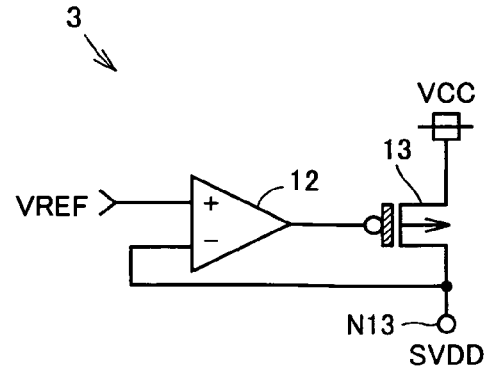
FIG. 3 is a circuit diagram that shows a configuration of an SVDD generation circuit shown in FIG. 1.

FIG. 3 is a circuit diagram that shows a configuration of SVDD generation circuit 3. In FIG. 3, SVDD generation circuit 3 includes an operational amplifier 12 and a P-channel MOS transistor 13. P-channel MOS transistor 13 is connected between the line for supplying external power supply voltage VCC and an internal power supply node N13. Operational amplifier 12 controls a gate voltage of P-channel MOS transistor 13 such that voltage SVDD of power supply node N13 matches reference voltage VREF. Therefore, internal power supply voltage SVDD is always maintained at a voltage (1.5 V) equal to reference voltage VREF.

Figure 4:
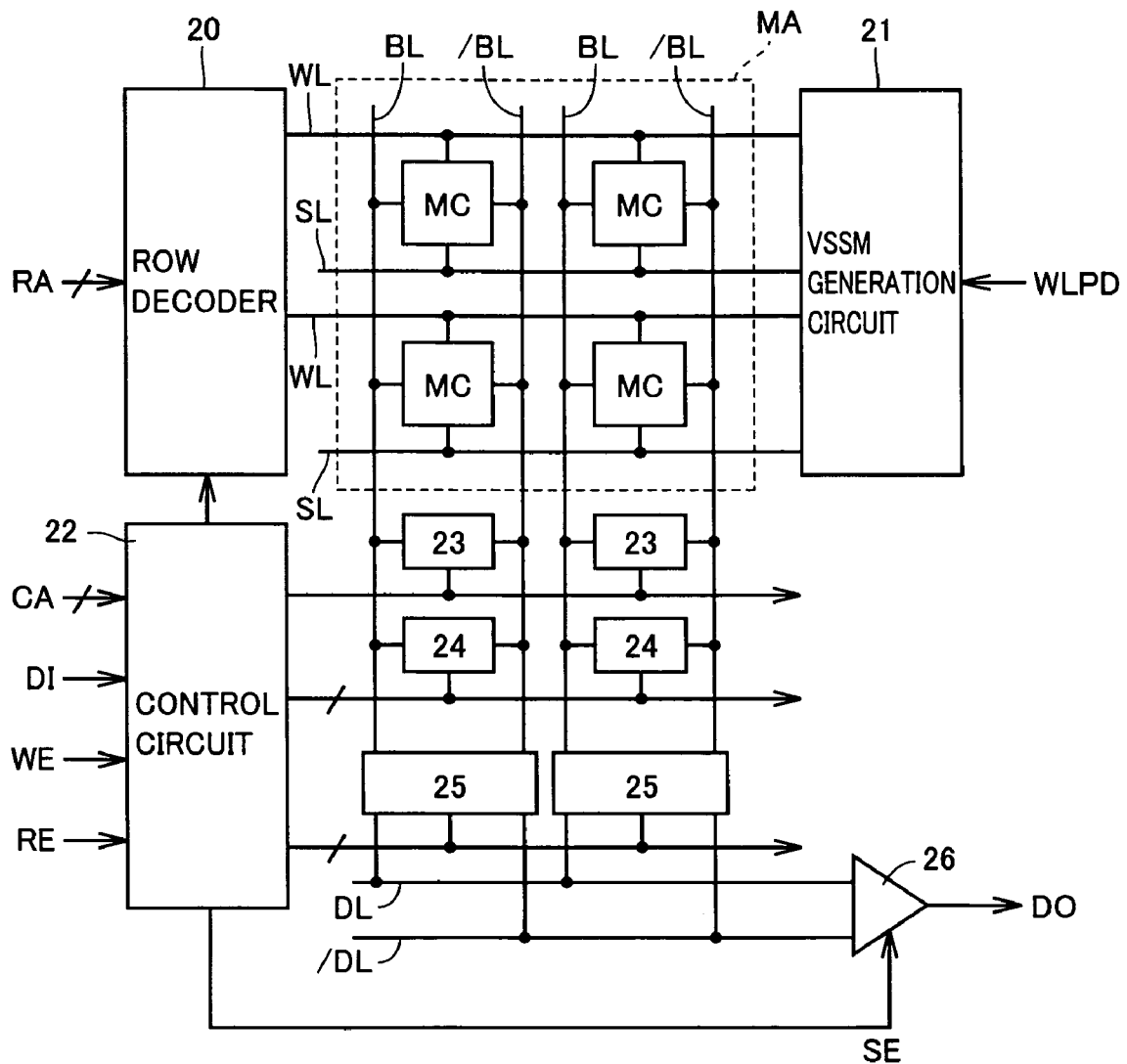
FIG. 4 is a block diagram that shows a configuration of an SRAM shown in FIG. 1.

FIG. 4 is a block diagram that shows a configuration of SRAM 7. In FIG. 4, SRAM 7 includes a memory cell array MA, a row decoder 20, and a VSSM generation circuit 21. Memory cell array MA includes a plurality of memory cells MC arranged in a plurality of rows and a plurality of columns, a plurality of word lines WL provided to correspond to the plurality of rows, respectively, a plurality of source lines SL provided to correspond to the plurality of rows, respectively, and a plurality of pairs of bit lines BL, /BL provided to correspond to the plurality of columns, respectively. Note that, although multiple memory cells MC are actually provided, only four memory cells MC are shown in FIG. 4 for simplifying the drawing.

Figure 5:
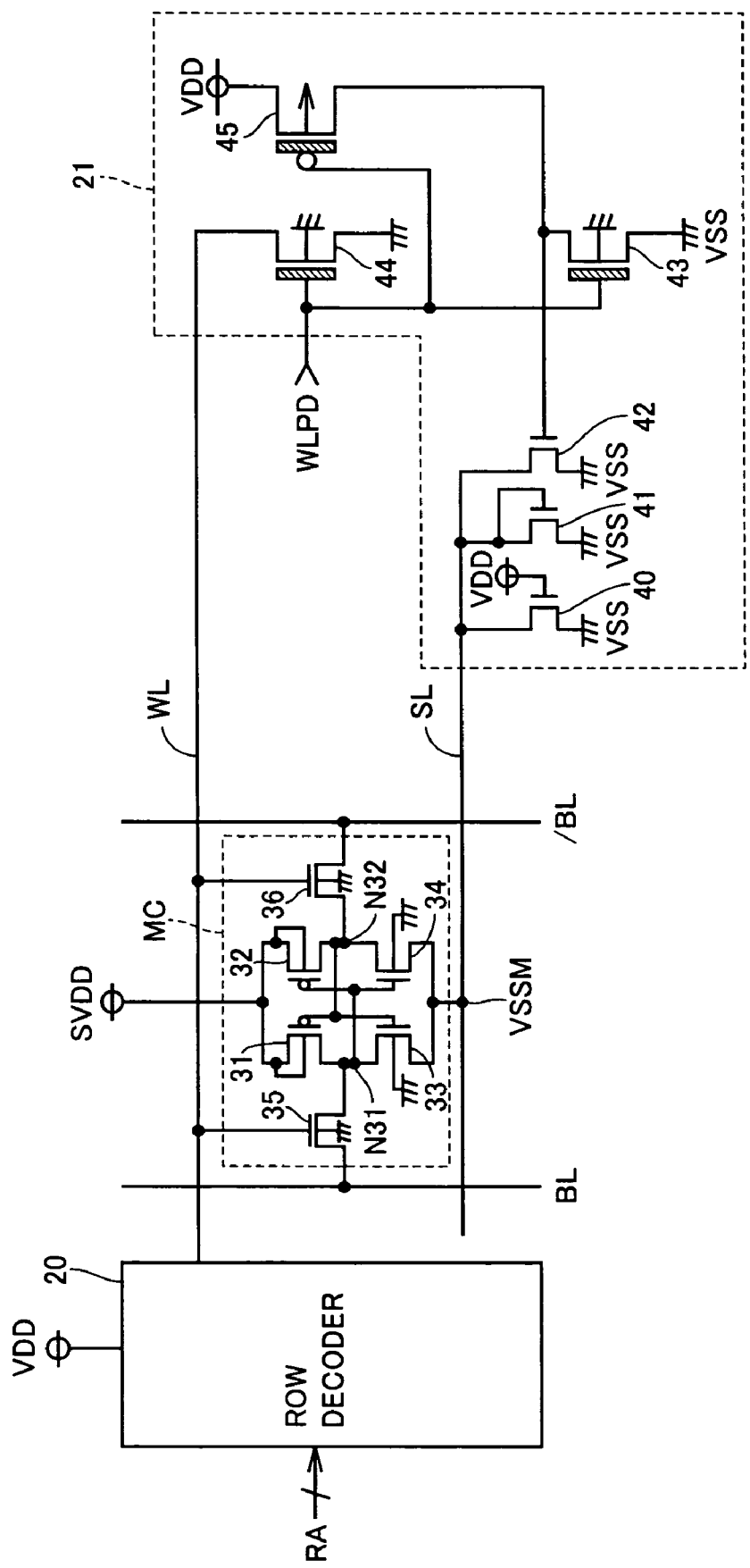
FIG. 5 is a circuit block diagram that shows configurations of a memory cell and a VSSM generation circuit shown in FIG. 4.

As shown in FIG. 5, memory cell MC includes load transistors (P-channel MOS transistors) 31, 32, driver transistors (N-channel MOS transistors) 33, 34, and access transistors (N-channel MOS transistors) 35, 36. Load transistors 31, 32 have sources both connected to a line for supplying internal power supply voltage SVDD, and have drains connected to storage nodes N31, N32, respectively, and have gates connected to storage nodes N32, N31, respectively. Driver transistors 33, 34 have sources both connected to the corresponding source line SL, have drains connected to storage nodes N31, N32, respectively, and have gates connected to storage nodes N32, N31, respectively. Access transistors 35, 36 have sources connected to storage nodes N31, N32, respectively, have drains connected to the corresponding bit lines BL, /BL, respectively, and have gates both connected to the corresponding word line WL.

Transistors 31, 33 configure an inverter, and output an inverted signal of a signal written into storage node N32, to storage node N31. Transistors 32, 34 configure an inverter, and output an inverted signal of a signal written into storage node N31, to storage node N32. Accordingly, transistors 31-34 configure a latch circuit that latches the data signals written into storage nodes N31, N32.

During a write operation, word line WL is set to a selection level, namely, an "H" level (internal power supply voltage VDD), access transistors 35, 36 are brought into a conduction state, bit line BL is connected to storage node N31, and bit line /BL is connected to storage node N32. In this state, in accordance with a write data signal, any one of bit lines BL, /BL is set to an "H" level (internal power supply voltage VDD) and the other bit line is set to an "L" level (ground voltage VSS), and the write data signal is written into storage nodes N31, N32.

For example, if the write data signal is "1", storage nodes N31, N32 are set to an "H" level and an "L" level, respectively, and if the write data signal is "0", storage nodes N31, N32 are set to an "L" level and an "H" level, respectively. If word line WL is set to a non-selection level, namely, an "L" level (ground voltage VSS), and access transistors 35, 36 are brought into a non-conduction state, the data signal written in storage nodes N31, N32 is latched by transistors 31-34.

During a read operation, after bit lines BL, /BL are both precharged to internal power supply voltage. VDD, word line WL is set to a selection level, namely, an "H" level, and access transistors 35, 36 are brought into a conduction state. If storage nodes N31, N32 are set to an "H" level and an "L" level, respectively, transistors 31, 34 are in conduction, and hence a current flows from bit line /BL to source line SL via transistors 36, 34, so that a voltage of bit line /BL is lowered. In contrast, if storage nodes N31, N32 are set to an "L" level and an "H" level, respectively, transistors 32, 33 are in conduction, and hence a current flows from bit line BL to source line SL via transistors 35, 33, so that a voltage of bit line BL is lowered. Therefore, by amplifying a voltage between bit lines BL, /BL and detecting the same, it is possible to read data stored in memory cell MC.

Row decoder 20 is driven by internal power supply voltage VDD, and during a normal operation, in accordance with a row address signal RA, selects any word line WL out of the plurality of word lines WL, and sets the selected word line WL to a selection level, namely, an "H" level to thereby activate each memory cell MC corresponding to the relevant word line WL.

A VSSM generation circuit 21 includes N-channel MOS transistors 40-44 and a P-channel MOS transistor 45. N-channel MOS transistor 40 is connected between source line SL and a line for supplying ground voltage VSS, has a gate receiving internal power supply voltage VDD, and configures a resistance element. N-channel MOS transistor 41 is connected between source line SL and the line for supplying ground voltage VSS, has a gate connected to source line SL, and configures a diode. N-channel MOS transistor 42 is connected between source line SL and the line for supplying ground voltage VSS, and configures a switching element for switching a voltage VSSM of source line SL to one of a voltage of 0 V (ground voltage VSS) and a voltage of 0.3 V (a threshold voltage of N-channel MOS transistor 41).

N-channel MOS transistor 43 is connected between the gate of N-channel MOS transistor 42 and the line for supplying ground voltage VSS, and has a gate receiving a control signal WLPD. N-channel MOS transistor 44 is provided to correspond to each word line WL, is connected between the corresponding word line WL and the line for supplying ground voltage VSS, and has a gate receiving control signal WLPD. P-channel MOS transistor 45 is connected between the line for supplying internal power supply voltage VDD and the gate of N-channel MOS transistor 42, and has a gate receiving control signal WLPD.

During a normal operation of the SRAM, control signal WLPD is set to a non-activated level, namely, an "L" level (ground voltage VSS). Thereby N-channel MOS transistor 44 is brought out of conduction, making it possible to set word line WL to a selection level. Furthermore, N-channel MOS transistor 43 is brought out of conduction, so that P-channel MOS transistor 45 is brought into conduction and N-channel MOS transistor 42 is brought into conduction, resulting in that voltage VSSM of source line SL is set to 0 V. Thereby a driving voltage of memory cell MC becomes as follows: SVDD−VSSM=1.5 V, and hence write/read rates for memory cell MC are increased, whereas electric power consumption is increased.

During standby of the SRAM, control signal WLPD is set to an activated level, namely, an "H" level (external power supply voltage VCC). Thereby N-channel MOS transistor 44 is brought into conduction, and word line WL is fixed to a non-selection level, namely, an "L" level (ground voltage VSS). Furthermore, N-channel MOS transistor 43 is brought into conduction, P-channel MOS transistor 45 is brought out of conduction, and N-channel MOS transistor 42 is brought out of conduction. Therefore, voltage VSSM of source line SL is set to 0.3 V, and a driving voltage of memory cell MC becomes as follows: SVDD−VSSM=1.2 V. Additionally, a threshold voltage of each of transistors 33-36 in memory cell MC is increased owing to a substrate effect, so that a standby current is reduced, and electric power consumption is decreased.

Note that a gate insulating film of each of transistors 11, 13, 43, 44, 45 to which 3 V is applied is set to be thicker than a gate insulating film of other transistors 40-42 to which a voltage of at most 1.5 V is applied. Therefore, a symbol for indicating a thick gate insulating film is used for each of transistors 11, 13, 43, 44, 45.

Returning to FIG. 4, SRAM 7 includes a control circuit 22, and an equalizer 23, write driver 24, and a column select gate 25, each of which is provided to correspond to each pair of bit lines BL, /BL, and a pair of data lines DL, /DL and a sense amplifier 26, each of which is provided in a manner shared by the plurality of pairs of bit lines BL, /BL.

Control circuit 22 is driven by internal power supply voltage VDD, and in accordance with a column address signal CA, a write data signal DI, and control signals WE, RE, controls equalizer 23, write driver 24, column select gate 25, and sense amplifier 26.

Figure 6:
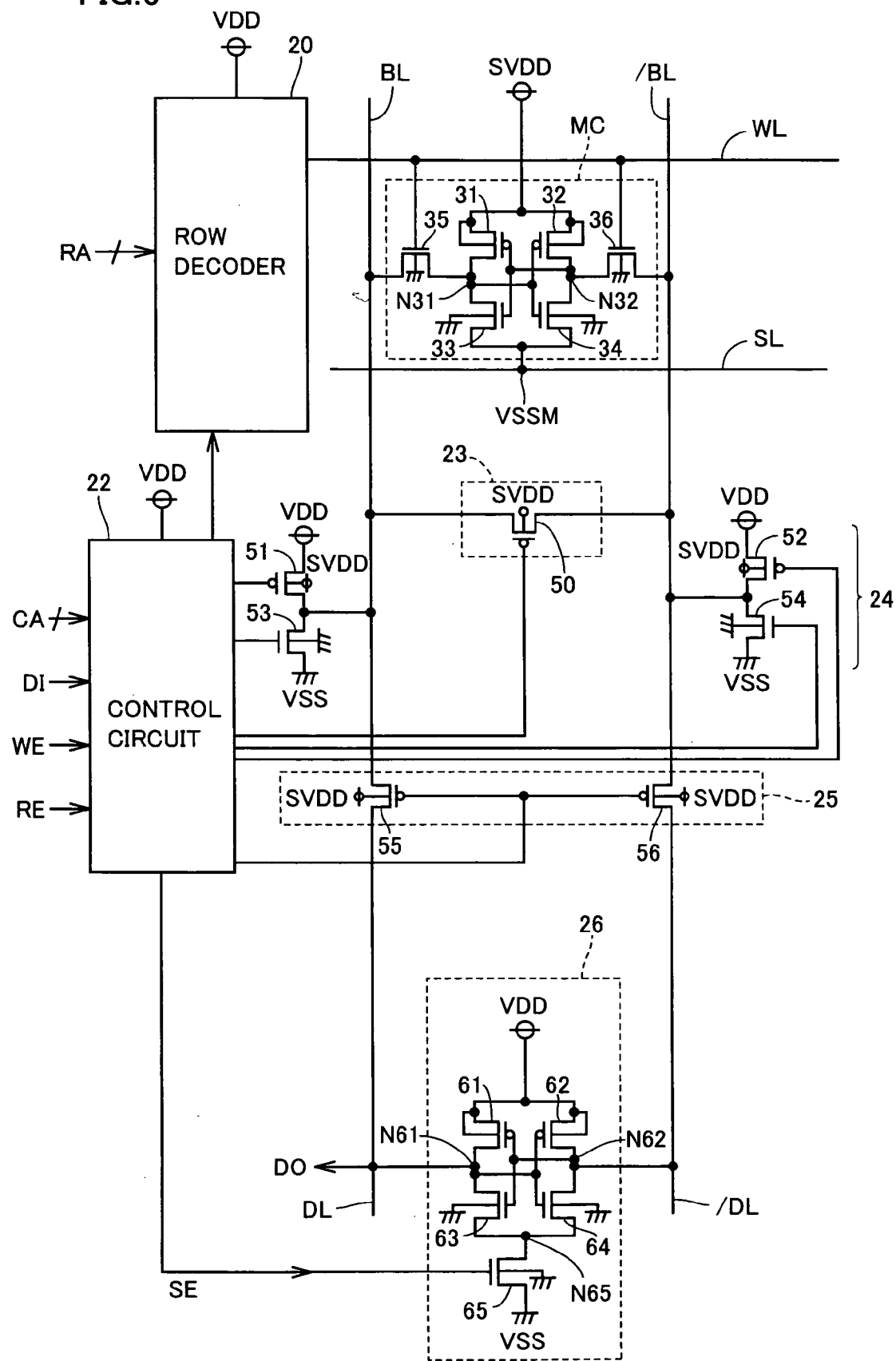
FIG. 6 is a circuit block diagram that shows configurations of an equalizer, a write driver, a column select gate, and a sense amplifier shown in FIG. 4.

As shown in FIG. 6, equalizer 23 includes a P-channel MOS transistor 50 controlled by control circuit 22. P-channel MOS transistor 50 is connected between the corresponding bit lines BL, /BL, and has a back gate receiving internal power supply voltage SVDD. When P-channel MOS transistor 50 is brought into conduction, bit line BL and bit line /BL are connected, and voltages of bit lines BL, /BL are equalized.

Write driver 24 includes P-channel MOS transistors 51, 52 and N-channel MOS transistors 53, 54 controlled by control circuit 22. P-channel MOS transistors 51, 52 have sources both receiving internal power supply voltage VDD, have drains connected to the corresponding bit lines BL, /BL, respectively, and have back gates both receiving internal power supply voltage SVDD. N-channel MOS transistors 53, 54 have sources both receiving ground voltage VSS, have drains connected to the corresponding bit lines BL, /BL, respectively, and have back gates both receiving ground voltage VSS.

When transistors 51, 54 are brought into conduction, an "H" level (internal power supply voltage VDD) and an "L" level (ground voltage VSS) are written into storage nodes N31, N32 via bit lines BL, /BL, respectively. When transistors 53, 52 are brought into conduction, an "L" level (ground voltage VSS) and an "H" level (internal power supply voltage VDD) are written into storage nodes N31, N32 via bit lines BL, /BL, respectively. When transistors 51, 52 are brought into conduction, bit lines BL, /BL are precharged to internal power supply voltage VDD.

Column select gate 25 includes P-channel MOS transistors 55, 56 controlled by control circuit 22. P-channel MOS transistor 55 is connected between the corresponding bit line BL and data line DL, has a back gate receiving internal power supply voltage SVDD, and has a gate connected to control circuit 22. P-channel MOS transistor 56 is connected between the corresponding bit line /BL and data line/DL, has a back gate receiving internal power supply voltage SVDD, and has a gate connected to the gate of P-channel MOS transistor 55. When P-channel MOS transistors 55, 56 are brought into conduction, voltages of bit lines BL, /BL are transmitted to data lines DL, /DL, respectively.

Sense amplifier 26 includes P-channel MOS transistors 61, 62 and N-channel MOS transistors 63-65. P-channel MOS transistors 61, 62 have sources both receiving internal power supply voltage VDD, have drains connected to input/output nodes N61, N62, respectively, and have gates connected to input/output nodes N62, N61, respectively.

N-channel MOS transistors 63, 64 have sources both connected to a node N65, have drains connected to input/output nodes N61, N62, respectively, and have gates connected to input/output nodes N62, N61, respectively. N-channel MOS transistor 65 is connected between node N65 and the line for supplying ground voltage VSS, and has a gate receiving a control signal SE output from control circuit 22. Input/output nodes N61, N62 are connected to data lines DL, /DL, respectively.

If control signal SE is at a non-activated level, namely, an "L" level (ground voltage VSS), N-channel MOS transistor 65 is brought out of conduction, and sense amplifier 26 is deactivated. When control signal SE is at an activated level, namely, an "H" level (internal power supply voltage VDD), N-channel MOS transistor 65 is brought into conduction, and sense amplifier 26 is activated.

If a voltage of data line DL is higher than a voltage of data line/DL, resistance values of transistors 61, 64 become smaller than resistance values of transistors 62, 63, and a voltage between data lines DL, /DL is amplified to internal power supply voltage VDD. In contrast, if a voltage of data line /DL is higher than a voltage of data line DL, resistance values of transistors 62, 63 become smaller than resistance values of transistors 61, 64, and a voltage between data lines /DL, DL is amplified to internal power supply voltage VDD. A voltage of data line DL is output as a read data signal DO.

Next, an operation of the SRAM will be described briefly. If control signal WE is set to an activated level, a write operation is performed. Row decoder 20 sets word line WL specified by row address signal RA to a selection level, namely, an "H" level, and activates each memory cell MC corresponding to the relevant word line WL.

If write data signal DI is at an "H" level, for example, control circuit 22 brings transistors 51, 54, out of transistors 51-54 that correspond to a column specified by column address signal CA, into conduction to set bit lines BL, /BL to an "H" level and an "L" level, respectively. If write data signal DI is at an "L" level, control circuit 22 brings transistors 52, 53, out of transistors 51-54, into conduction to set bit lines BL, /BL to an "L" level and an "H" level, respectively. By doing so, data signal DI is written into memory cell MC specified by address signals RA, CA.

If control signal RE is set to an activated level, a read operation is performed. Control circuit 22 brings transistors 51, 52 corresponding to all the columns into conduction to precharge bit lines BL, /BL to internal power supply voltage VDD, and brings transistor 50 into conduction to equalize voltages of bit lines BL, /BL. Row decoder 20 sets word line WL specified by row address signal RA to an selection level, namely, an "H" level, and activates each memory cell MC corresponding to the relevant word line WL. By doing so, a voltage between each pair of bit lines BL, /BL varies in accordance with data stored in the corresponding activated memory cell MC.

Control circuit 22 brings transistors 55, 56 corresponding to a column specified by column address signal CA into conduction, and allows voltages of bit lines BL, /BL of the relevant column to be transmitted to data lines DL, /DL, respectively, and furthermore, sets control signal SE to an activated level, namely, an "H" level to activate sense amplifier 26. By doing so, a voltages between a pair of data lines DL, /DL is amplified by sense amplifier 26, and a voltage of data line DL is output as a read data signal DO.

SRAM 7 is characterized in that internal power supply voltage SVDD for memory cell MC, instead of internal power supply voltage VDD for a peripheral circuit, is applied to each back gate of P-channel MOS transistors 50-52, 55, 56 included in equalizer 23, write driver 24, and column select gate 25. Accordingly, even if internal power supply voltage VDD for a peripheral circuit is set to 0 V during standby, a threshold voltage of each of transistors 50-52, 55, 56 is maintained at a relatively large value, and hence it is possible to reduce a leakage current flowing from the line for supplying internal power supply voltage SVDD to the line for supplying internal power supply voltage VDD via transistors 31, 32, 35, 36 in memory cell MC, bit lines BL, /BL, and transistors 50-52, 55, 56.

Figure 7A:
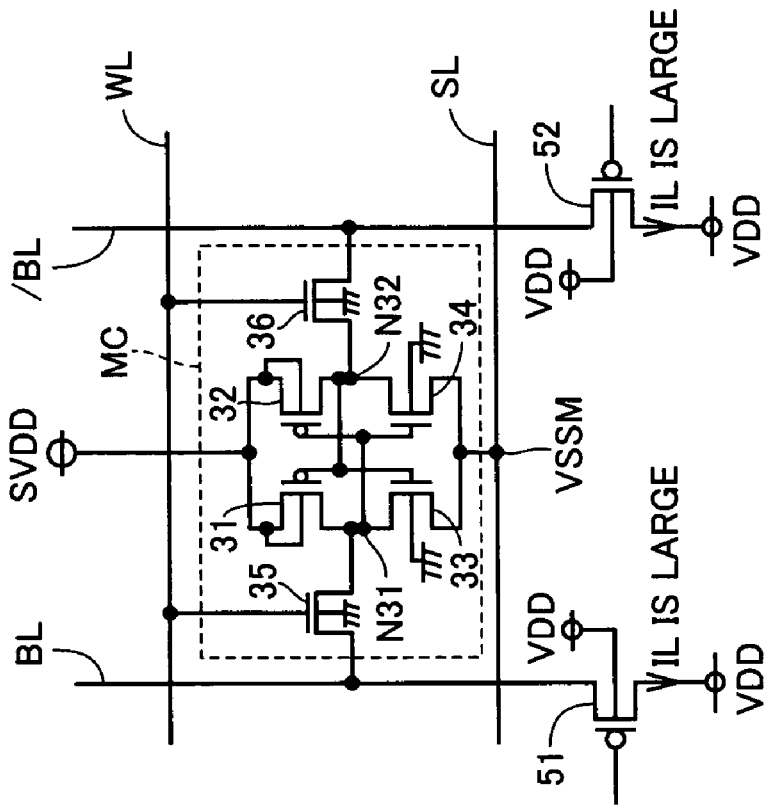
FIGS. 7A and 7B are circuit diagrams for describing effects of the first embodiment.
Figure 7B:
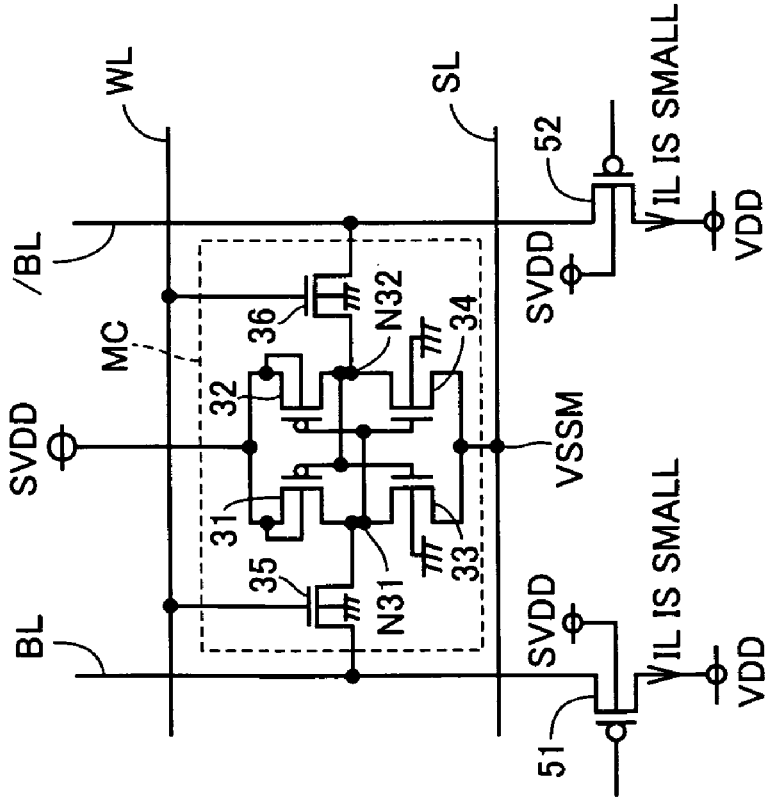

FIGS. 7A and 7B are provided for comparing the invention of the present application and the conventional example. FIGS. 7A and 7B only show transistors 51, 52, out of transistors 50-52, 55, 56, as representative examples. In SRAM 7 in the present application, internal power supply voltage SVDD for a memory cell is applied to back gates of transistors 51, 52. In contrast, in the conventional SRAM, internal power supply voltage VDD for a peripheral circuit is applied to back gates of transistors 51, 52. In both of the SRAMs, internal power supply voltage VDD is set to 0 V during standby to reduce current consumption.

In the SRAM in the present application, internal power supply voltage SVDD for a memory cell is applied to the back gates of transistors 51, 52, and hence even if internal power supply voltage VDD is set to 0 V, a threshold voltage of each of transistors 51, 52 is maintained at a high level, and hence a leakage current IL is small. In contrast, in the conventional SRAM, internal power supply voltage VDD for a peripheral circuit is applied to the back gates of transistors 51, 52, and hence if internal power supply voltage VDD is set to 0 V, a threshold voltage of each of transistors 51, 52 is lowered, causing increase in leakage current IL.

Figure 8A:
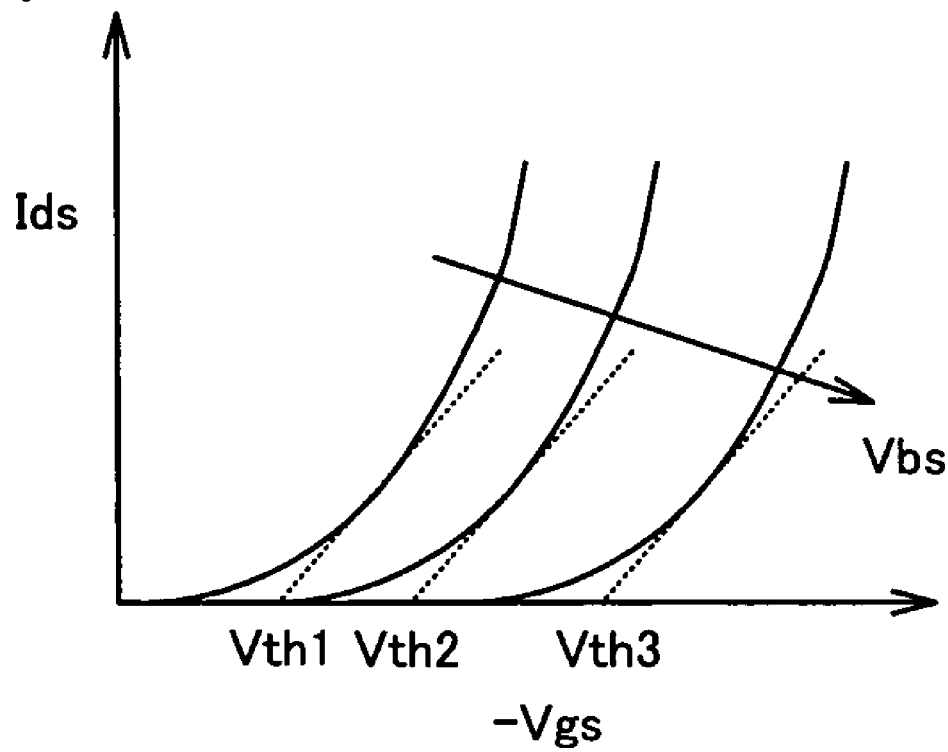
FIGS. 8A and 8B are diagrams each showing a relationship between a back gate voltage and a threshold voltage of a P-channel MOS transistor shown in FIGS. 7A and 7B.
Figure 8B:
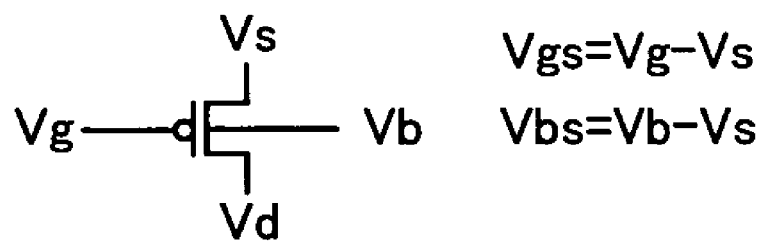

FIGS. 8A and 8B each shows a relationship between a back gate voltage Vb and a threshold voltage Vth of a P-channel MOS transistor. In FIGS. 8A and 8B, Vgs represents a difference between a gate voltage Vg and a source voltage Vs, namely, a voltage Vg−Vs, Vbs represents a difference between back gate voltage Vb and source voltage Vs, namely, a voltage Vb−Vs, and Ids represents a current flowing from the source to the drain. As seen from FIGS. 8A and 8B, an increase in voltage (−Vgs) causes an increase in current Ids. Furthermore, an increase in voltage Vbs causes an increase in absolute value of threshold voltage Vth. In the SRAM in the invention of the present application, Vbs during standby is as follows: SVDD−VDD=1.5 V−0V=1.5 V. In contrast, in the conventional SRAM, Vbs during standby is as follows: VDD−VDD=0 V. Therefore, a threshold voltage of each of transistors 51, 52 in the SRAM in the invention of the present application becomes higher than a threshold voltage of each of transistors 51, 52 in the conventional SRAM.

Second Embodiment

Figure 9:
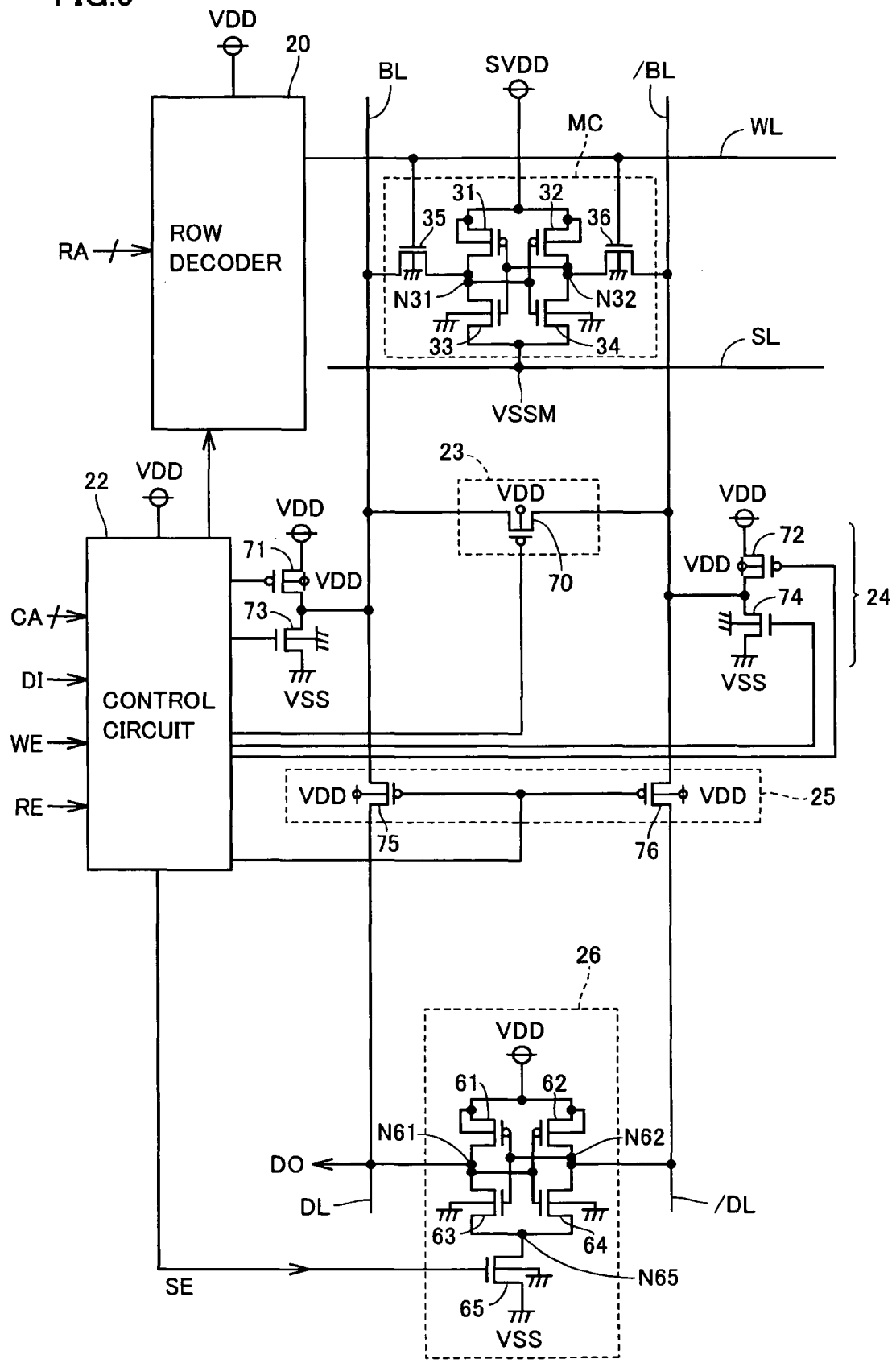
FIG. 9 is a circuit block diagram that shows a substantial part of an SRAM according to a second embodiment of the present invention.

FIG. 9 is a circuit block diagram that shows a substantial part of an SRAM according to a second embodiment of the present invention, in comparison with FIG. 6. With reference to FIG. 9, the SRAM differs from the SRAM in the first embodiment in that transistors 50-56 are replaced with transistors 70-76, respectively, and that internal power supply voltage VDD for a peripheral circuit is applied to each back gate of transistors 70-72, 75, 76. An absolute value of a threshold voltage of all the transistors 31-36, 50-56, 61-65 in FIG. 6 is 0.3 V, while an absolute value of a threshold voltage of transistors 70-76 is set to 0.5 V.

In the second embodiment, the threshold voltage of transistors 70-76 is set at a high level, and hence even if internal power supply voltage VDD is set to 0 V during standby, leakage current IL is small.

Third Embodiment

Figure 10:
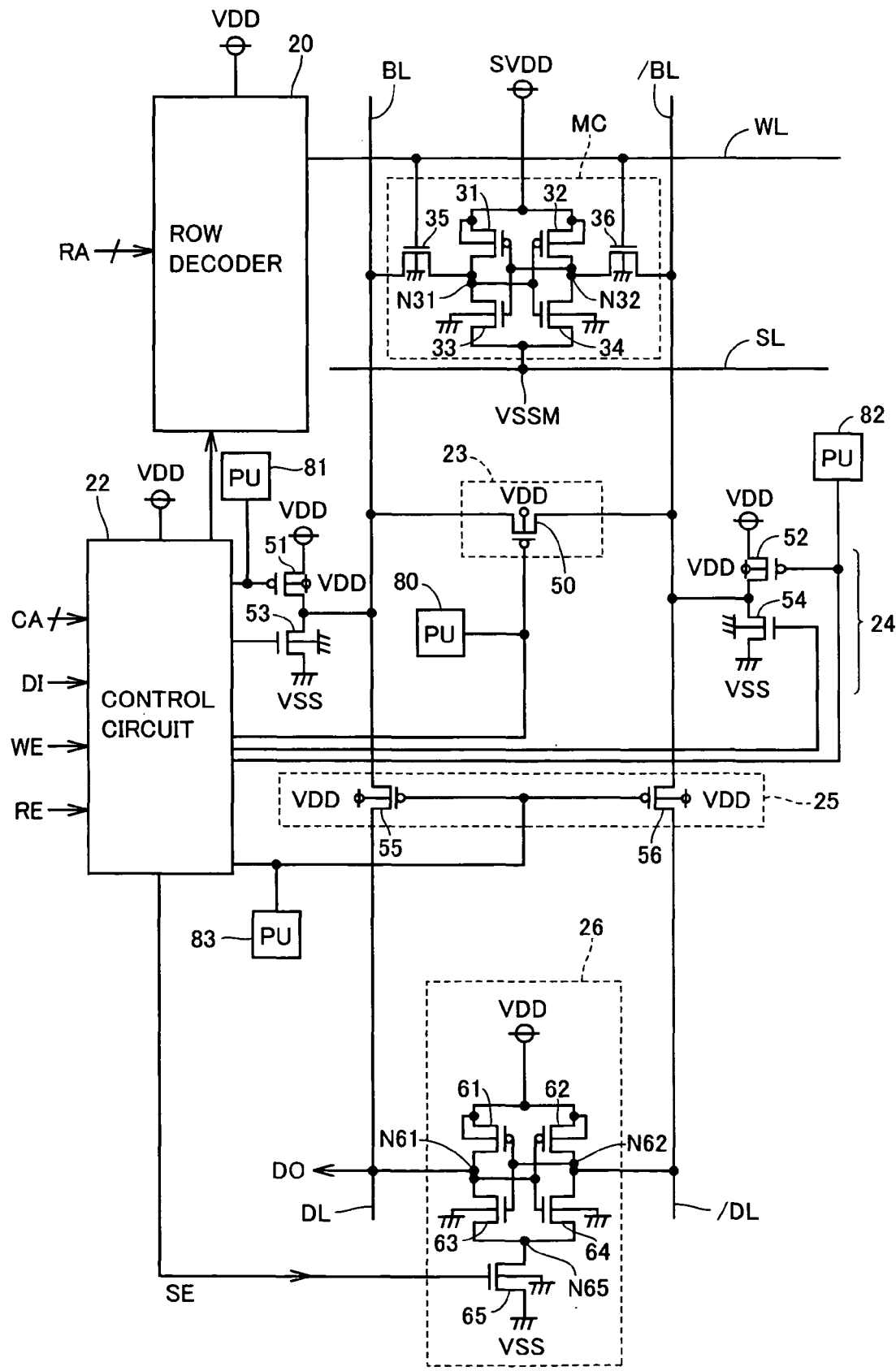
FIG. 10 is a circuit block diagram that shows a substantial part of an SRAM according to a third embodiment of the present invention.

FIG. 10 is a circuit block diagram that shows a substantial part of an SRAM according to a third embodiment of the present invention, in comparison with FIG. 6. With reference to FIG. 10, the SRAM differs from the SRAM in the first embodiment in that internal power supply voltage VDD is applied to each back gate of P-channel MOS transistors 50-52, 55, 56, and that pull-up circuits (PU) 80-83 are added. Pull-up circuits 80-82 are connected to gates of P-channel MOS transistors 50-52, respectively, and pull-up circuit 83 is connected to gates of P-channel MOS transistors 55, 56. Each of pull-up circuits 80-83 pulls up the gate of the corresponding P-channel MOS transistor to an "H" level (internal power supply voltage SVDD) during standby, and fixes the corresponding P-channel MOS transistor to a non-conduction state.

Figure 11:
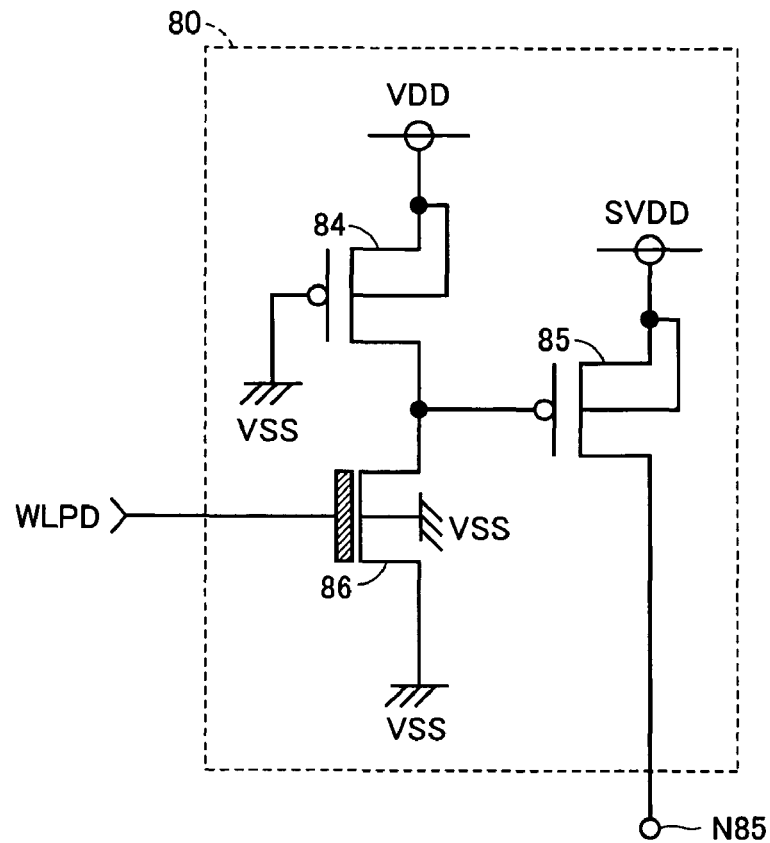
FIG. 11 is a circuit diagram that shows a configuration of a pull-up circuit shown in FIG. 10.

As shown in FIG. 11, pull-up circuit 80 includes P-channel MOS transistors 84, 85 and an N-channel MOS transistor 86. P-channel MOS transistor 84 has a source and a back gate both receiving internal power supply voltage VDD for a peripheral circuit, and has a gate receiving ground voltage VSS. P-channel MOS transistor 84 configures a resistance element. N-channel MOS transistor 86 has a source and a back gate both receiving ground voltage VSS, has a drain connected to the drain of P-channel MOS transistor 84, and a gate receiving control signal WLPD. P-channel MOS transistor 85 has a source and a back gate both receiving internal power supply voltage SVDD for memory cell MC, has a gate connected to the drain of P-channel MOS transistor 84, and has a drain connected to an output node N85. Output node N85 is connected to the gate of the corresponding P-channel MOS transistor 50.

During a normal operation, control signal WLPD is set to a non-activated level, namely, an "L" level (ground voltage VSS) and N-channel MOS transistor 86 is brought out of conduction. Thereby the gate of P-channel MOS transistor 85 is charged to an "H" level (internal power supply voltage VDD), P-channel MOS transistor 85 is brought out of conduction, and output node N85 is brought into a floating state. Therefore, the corresponding P-channel MOS transistor 50 becomes controllable by control circuit 22.

During standby, control signal WLPD is set to an activated level, namely, an "H" level (external power supply voltage VCC), and N-channel MOS transistor 86 is brought into conduction. Thereby, the gate of P-channel MOS transistor 85 is discharged to an "L" level (ground voltage VSS), P-channel MOS transistor 85 is brought into conduction, and output node N85 is set to an "H" level (internal power supply voltage SVDD). Therefore, the corresponding P-channel MOS transistor 50 is fixed to a non-conduction state. Note that during standby, internal power supply voltage VDD for a peripheral circuit is shut off, and hence an output terminal of each control signal of control circuit 22 is brought into a floating state. Each of other pull-up circuits 81-83 has the same configuration as that of pull-up circuit 80.

In the third embodiment, P-channel MOS transistors 50-52, 55, 56 are fixed to a non-conduction state during standby, and hence a leakage current is small.

Figure 12:
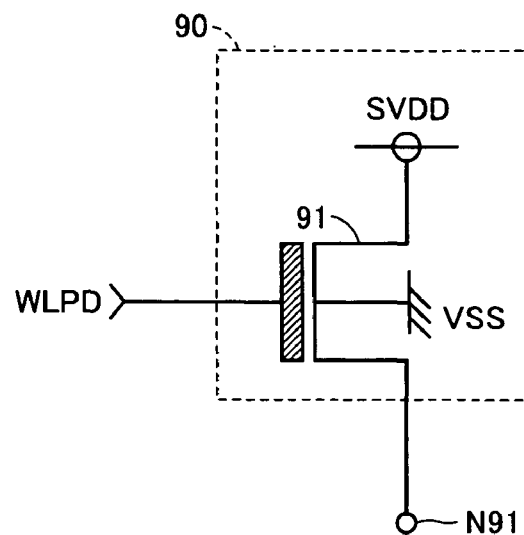
FIG. 12 is a circuit diagram that shows a modification of the third embodiment.

FIG. 12 is a circuit diagram that shows a modification of the third embodiment. In this modification, each of pull-up circuits 80-83 is replaced with a pull-up circuit 90. Pull-up circuit 90 includes an N-channel MOS transistor 91. N-channel MOS transistor 91 has a drain receiving internal power supply voltage SVDD for a peripheral circuit, has a back gate receiving ground voltage VSS, has a gate receiving control signal WLPD, and has a source connected to an output node N91. Output node N91 is connected to the gate of the corresponding P-channel MOS transistor out of P-channel MOS transistors 50-52, 55, 56.

During a normal operation, control signal WLPD is set to a non-activated level, namely, an "L" level (ground voltage VSS), N-channel MOS transistor 91 is brought out of conduction, and output node N91 is brought into a floating state. Therefore, the corresponding P-channel MOS transistor becomes controllable by control circuit 22.

During standby, control signal WLPD is set to an activated level, namely, an "H" level (external power supply voltage VCC), N-channel MOS transistor 91 is brought into conduction, and output node N91 is set to an "H" level (internal power supply voltage SVDD). Therefore, the corresponding P-channel MOS transistor is fixed to a non-conduction state.

In this modification, effects similar to those of the third embodiment can be obtained, and additionally, the pull-up circuit requires a smaller number of elements.

In the first to third embodiments described above, there has been described the case where the invention of the present application is applied to the SRAM provided with memory cell MC including six transistors 31-36. However, the invention of the present application is also applicable to a type of SRAM in which each of driver transistors 31, 32 is replaced with a resistance element. Furthermore, it is of course possible to combine as appropriate the first to third embodiments as described above.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor memory device driven by first and second power supply voltages during a normal operation, said second power voltage supplied to the semiconductor memory device being shut off during standby, the semiconductor memory device comprising:
 a memory cell driven by said first power supply voltage and storing data,
 a write/read circuit driven by said second power supply voltage and writing data into and reading data from said memory cell, and
 a pair of bit lines connected to said memory cell,
 said write/read circuit including a P-channel MOS transistor having a back gate receiving said first power supply voltage, having a source receiving said second power supply voltage, and having a drain connected to said memory cell, wherein said write/read circuit includes a decoder activating said memory cell during a write operation, and a write circuit setting any one bit line in said pair of bit lines to said second power supply voltage and setting the other bit line to a ground voltage in accordance with a write data signal, and writing said write data signal into said memory cell activated by said decoder, and said write circuit includes said P-channel MOS transistor provided to correspond to each of the bit lines and having the drain connected to said memory cell via the corresponding bit line.

2. A semiconductor memory device driven by first and second power supply voltages during a normal operation, said second power supply voltage supplied to the semiconductor memory device being shut off during standby, the semiconductor memory device comprising:

a memory cell driven by said first power supply voltage and storing data, a write/read circuit driven by said second power supply voltage and writing data into and reading data from said memory cell, and a pair of bit lines connected to said memory cell, said write/read circuit including a P-channel MOS transistor having a back gate receiving said first power supply voltage, having a source receiving said second power supply voltage, and having a drain connected to said memory cell, wherein said write/read circuit includes a charging circuit charging said pair of bit lines to said second power supply voltage during a read operation, a decoder activating said memory cell, and lowering a voltage of any one bit line in said pair of bit lines in accordance with data stored in said memory cell, a gate circuit allowing a potential difference produced between said pair of bit lines in accordance with data stored in said memory cell activated by said decoder to be transmitted to a pair of input/output nodes, and a sense amplifier amplifying said potential difference between said pair of input/output nodes, and each of said charging circuit and said gate circuit has said P-channel MOS transistor provided to correspond to each of the bit lines and having the drain connected to said memory cell via the corresponding bit line.

3. The semiconductor memory device according to claim 1, wherein said semiconductor memory device is of a static type.

4. A semiconductor memory device driven by first and second power supply voltages during a normal operation, said second power supply voltage supplied to the semiconductor memory device being shut off during standby, the semiconductor memory device comprising:

a memory cell driven by said first power supply voltage and storing data;

a write/read circuit driven by said second power supply voltage and writing data into and reading data from said memory cell, said write/read circuit including a P-channel MOS transistor having a source receiving said second power supply voltage, and having a drain connected to said memory cell; and a pull-up circuit providing said first power supply voltage to a gate of said P-channel MOS transistor during said standby to thereby bring said P-channel MOS transistor out of conduction.

5. The semiconductor memory device according to claim 4, further comprising a pair of bit lines connected to said memory cell, wherein said write/read circuit includes a decoder activating said memory cell during a write operation, and a write circuit setting any one bit line in said pair of bit lines to said second power supply voltage and setting the other bit line to a ground voltage in accordance with a write data signal, and writing said write data signal into said memory cell activated by said decoder, and said write circuit includes said P-channel MOS transistor provided to correspond to each of the bit lines and having the drain connected to said memory cell via the corresponding bit line.

6. The semiconductor memory device according to claim 4, further comprising a pair of bit lines connected to said memory cell, wherein said write/read circuit includes a charging circuit charging said pair of bit lines to said second power supply voltage during a read operation, a decoder activating said memory cell, and lowering a voltage of any one bit line in said pair of bit lines in accordance with data stored in said memory cell, a gate circuit allowing a potential difference produced between said pair of bit lines in accordance with data stored in said memory cell activated by said decoder to be transmitted to a pair of input/output nodes, and a sense amplifier amplifying said potential difference between said pair of input/output nodes, and each of said charging circuit and said gate circuit has said P-channel MOS transistor provided to correspond to each of the bit lines and having the drain connected to said memory cell via the corresponding bit line.

7. The semiconductor memory device according to claim 4, wherein said semiconductor memory device is of a static type.

8. A semiconductor memory device driven by first and second power supply voltages during a normal operation, said second power supply voltage supplied to the semiconductor memory device being shut off during standby, the semiconductor memory device comprising:

a memory cell driven by said first power supply voltage and storing data; and a write/read circuit driven by said second power supply voltage and writing data into and reading data from said memory cell, said write/read circuit including a first P-channel MOS transistor having a first threshold voltage, and a second P-channel MOS transistor having a source receiving said second power supply voltage, having a drain connected to said memory cell, and having a second threshold voltage, an absolute value of said second threshold voltage being larger than an absolute value of said first threshold voltage.

9. The semiconductor memory device according to claim 8, further comprising a pair of bit lines connected to said memory cell, wherein said write/read circuit includes a decoder activating said memory cell during a write operation, and a write circuit setting any one bit line in said pair of bit lines to said second power supply voltage and setting the other bit line to a ground voltage in accordance with a write data signal, and writing said write data signal into said memory cell activated by said decoder, and said write circuit includes said second P-channel MOS transistor provided to correspond to each of the bit lines and having the drain connected to said memory cell via the corresponding bit line.

10. The semiconductor memory device according to claim 8, further comprising a pair of bit lines connected to said memory cell, wherein said write/read circuit includes a charging circuit charging said pair of bit lines to said second power supply voltage during a read operation, a decoder activating said memory cell, and lowering a voltage of any one bit line in said pair of bit lines in accordance with data stored in said memory cell, a gate circuit allowing a potential difference produced between said pair of bit lines in accordance with data stored in said memory cell activated by said decoder to be transmitted to a pair of input/output nodes, and a sense amplifier amplifying said potential difference between said pair of input/output nodes, and each of said charging circuit and said gate circuit has said second P-channel MOS transistor provided to correspond to each of the bit lines and having the drain connected to said memory cell via the corresponding bit line.

11. The semiconductor memory device according to claim 8, wherein said semiconductor memory device is of a static type.

* * * * *